United States Patent [19]

Carlson

[11] 3,723,882

[45] Mar. 27, 1973

[54] MULTI-BAND TELEVISION TUNER ARRANGEMENT

[75] Inventor: Reuben C. Carlson, Bloomingdale, Ill.

[73] Assignee: Zenith Radio Corporation, Chicago, Ill.

[22] Filed: Aug. 2, 1971

[21] Appl. No.: 168,230

[52] U.S. Cl. ..................325/357, 325/452, 325/458, 325/461

[51] Int. Cl. ..............................................H04b 1/26

[58] Field of Search...317/101 R; 325/352, 353, 357, 325/452, 458, 461; 334/3, 47, 56, 77, 85, 88

[56] References Cited

UNITED STATES PATENTS

| | | | |
|---|---|---|---|
| 3,400,345 | 9/1968 | Oloff | 334/3 X |
| 3,387,214 | 6/1968 | Meyer | 325/355 X |
| 2,868,984 | 1/1959 | Countermash et al | 325/465 X |

*Primary Examiner*—Benedict V. Safourek
*Attorney*—John J. Pederson and Cornelius J. O'Connor

[57] ABSTRACT

A tuning arrangement for selectively tuning a television receiver to a desired channel in the VHF or the UHF frequency bands comprises adjacently disposed VHF and UHF tuner housings. Each housing includes groups of wave signal selectors continuously tunable across the VHF and UHF bands. A rotatable tuning shaft, extending through the VHF housing, supports oppositely disposed VHF and UHF capacitor electrodes for tuning the wave signal selectors. A band selector serves to operatively couple a desired group of frequency selectors to utilization circuitry in the receiver. A presettable driver, comprising a programmer, is directly coupled to the tuning shaft for rotating the shaft to tune that group of wave signal selectors coupled to the receiver's utilization circuitry.

11 Claims, 4 Drawing Figures

MULTI-BAND TELEVISION TUNER ARRANGEMENT

BACKGROUND OF THE INVENTION

This invention relates in general to a multi-band wave signal tuning arrangement and in particular to a combination VHF-UHF tuner for a television receiver.

Television receivers marketed in the U.S. today are required to have a tuner arrangement capable of receiving 12 VHF channels and 70 UHF channels. Until recently this requirement could be met with a thirteen-position tuning apparatus in which twelve of the positions are allocated to VHF channels and selected by a switch or turret type tuner while a desired one of the 70 UHF channels is selected by adjusting a separate continuous type tuner which is activated when the tuning apparatus is positioned to the thirteenth or UHF position. However, in order to comply with regulations recently adopted by the Federal Communications Commission, the tuning apparatus for a domestic television receiver must now afford the viewer "equalized" tuning in the VHF and UHF bands. Stated simply, this requirement means that the tuning arrangement must be so designed as to enable the viewer to select, with equal ease, a VHF channel or a UHF channel.

In the past, the manner in which VHF or UHF channels were selected posed no significant problems since the 13-position detent type tuner was not only practical but acceptable. It would then seem that the obvious solution to "equalized" tuning would be to provide a UHF tuner with a detent or stop for each UHF channel. While such a detent arrangement is attainable, it is neither feasible nor practical in view of the fact that seventy channel assignments in the UHF spectrum must be accommodated.

Insofar as UHF channel selection, and in some cases VHF, is concerned, the prior art has witnessed the development of a variety of continuous type tuners. In such devices, channel selection is achieved by adjusting a variable capacitor to tune an inductor which in the case of UHF, constitutes a quarter-wave transmission line. In general, the inductor is a fixed value component which is conductively connected to a stator electrode of the variable capacitor while the adjustable or rotor electrodes of the capacitor are connected to a control shaft. Rotation of the control shaft then changes the capacitance applied across the inductor which, in turn, varies the resonant frequency of the tuned circuit. It is the practice in such tuners to afford the control shaft a rotational displacement of approximately 180° which, in itself, poses no particular problems. However, when it is desired to provide this type tuner with a pre-set mechanism to convert the tuner, in effect, to a discrete type channel selector, the mechanical considerations presented in exercising control over a shaft that must be rotatable through 180° (or even 90°) presents difficult problems, particularly at the extreme reaches of shaft displacement. This is most apparent in the case of a pre-set mechanism comprising a plurality of longitudinally displaceable actuators, wherein the resulting locations of the actuators, which correspond to selected channels must be converted to angular displacements of the control shaft.

The problem, of course, entails not only the difficulty attendant upon translating linear displacements to angular displacements, but also that encountered in achieving channel preselection with a high degree of repeat accuracy. Such accuracy is defined as the ability of the pre-set mechanism to consistently return the control shaft to exact predetermined positions each time the actuators associated with those positions assume the indexing station of the pre-set mechanism. Prior art pre-set mechanisms leave much to be desired insofar as repeat accuracy is concerned because of lost motion in the actuating elements, back lash, etc. Moreover, in switching from one tuner control shaft to another, as is the case in prior art VHF-UHF dual tuner pre-set arrangements, an additional detriment to repeat accuracy is introduced as control is transferred from one shaft to the other.

SUMMARY OF THE INVENTION

It is therefore a principal object of the invention to provide an improved VHF-UHF tuning arrangement that meets FCC "equalized" tuning requirements.

It is another object of the invention to provide an improved VHF-UHF tuning arrangement utilizing a single tuning shaft.

It is a specific object of the invention to provide a VHF-UHF tuning arrangement in which VHF and UHF channel preselection is achieved with a high degree of repeat accuracy.

It is a further object of the invention to provide a VHF-UHF equalized tuning arrangement of economic construction and characterized by ease of mechanical alignment and assembly.

In accordance with the invention a tuning arrangement for selectively tuning a television receiver to any channel in the VHF or UHF frequency bands comprises a first housing that encloses a first tunable reactance circuit and a second housing disposed adjacent to the first housing and enclosing a second tunable reactance circuit. A tuning shaft, which extends through one of the housings, is rotatably mounted for displacement through a predetermined angular range. This shaft supports a first electrode that extends into the first housing to form, when coupled to the first reactance circuit, a first resonant wave signal selector which is tunable across one of the frequency bands. The shaft further supports a second electrode that extends into the second housing to form, when coupled to the second reactance circuit, a second resonant wave signal selector tunable across the other of the frequency bands. A band selector is provided for operatively coupling one of the frequency selectors to wave signal utilization circuitry in the receiver. Finally, drive means, engageable with the tuning shaft, is provided for positioning the first and second electrodes, relative to their associated reactance circuits, to tune that one of the signal selectors coupled to the utilization circuitry to any television channel within its band.

DESCRIPTION OF A PREFERRED EMBODIMENT

Figure 1:
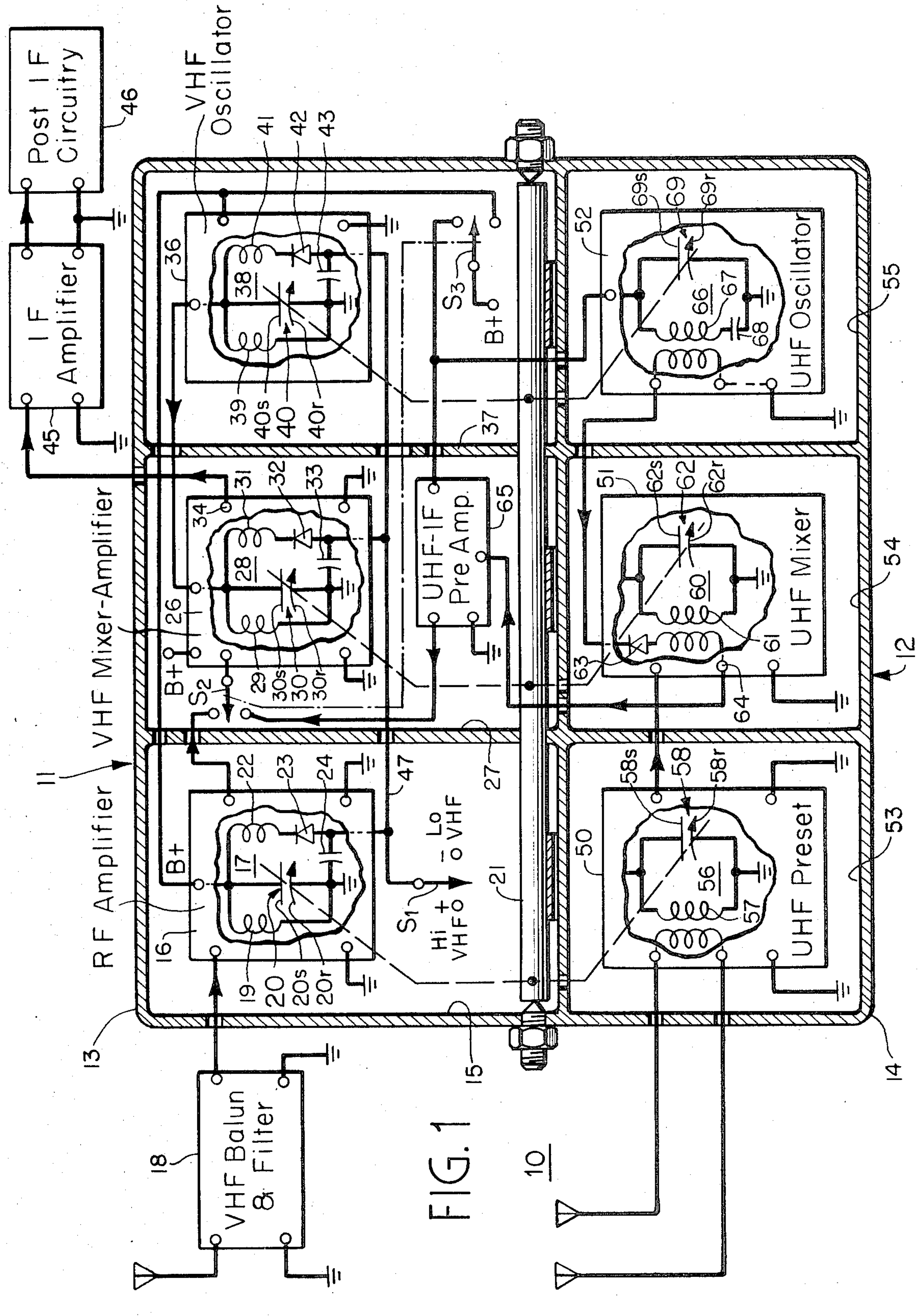
FIG. 1 is a diagrammatical representation, partially in schematic form, of a tuning arrangement embodying the invention.

The television tuner arrangement 10, which is depicted partially in schematic form in FIG. 1, is tunable to any channel in the VHF and UHF frequency bands and, to this end, employs a continuously adjustable VHF tuner 11 and a similarly adjustable UHF tuner 12. VHF tuner 11 comprises a housing 13 that encloses RF, mixer and oscillator stages within assigned compartment while like stages for the UHF tuner are enclosed in a compartmented housing 14 physically disposed in a back-to-back relation to housing 11. At the outset the description of tuners 11 and 12 will be confined to their electrical characteristics; the mechanical aspects will be dealt with in detail later.

Accordingly, attention is directed to VHF tuner 11 and, initially, to the RF stage which is enclosed in a compartment 15 of housing 13. This stage includes an RF amplifier 16 having a tunable wave signal preselector 17 which is coupled to an antenna through a conventional balun and filter circuit 18. Preselector 17 comprises a fixed reactance element in the form of an inductor 19 which is tunable across the low frequency portion of the VHF band, i.e. channels 2-6 by a resonating capacitor 20 having a stator electrode $20_s$ coupled to inductor 19 and a rotor electrode $20_r$ affixed to a conductive tuning shaft 21 which is electrically connected to reference potential, i.e., the tuner housing, by conductive straps. An auxiliary inductor 22 is connectable, via a diode 23 and a decoupling capacitor 24, across inductor 19 in order to reduce the effective inductance of component 19 thereby permitting the paralleled combination of inductors 19 and 22 to be tuned across the high end of the VHF band, i.e., channels 7-13, by capacitor 20. As shown, the anode of diode 23 is connectable through a switch $S_1$ to positive and negative biasing potentials in order to condition preselector 17 for operation in the high and low frequency portions, respectively, of the VHF band.

The output of RF amplifier 16 is applied through a switch $S_2$ to a VHF mixer and amplifier stage 26 which is enclosed in an adjacent compartment 27 of housing 13. Stage 26 also includes a tuned frequency selector circuit 28 comprising a principal fixed inductor 29, an adjustable tuning capacitor 30 shunted across inductor 29 and comprising a stator $30_s$ coupled to inductor 29 and a rotor $30_r$ fixed to tuning shaft 21. An auxiliary inductor 31 is connectable across inductor 29 by a switching diode 32 and a decoupling capacitor 33 to facilitate tuning selector 28 to the high end of the VHF band. The output signal of selector circuit 28, together with a heterodyning signal from a local oscillator, are applied to a combination mixer and amplifier device, not shown, which derives, in conventional fashion, an IF output signal at terminal 34.

An oscillator stage 36 constitutes the source of the aforementioned heterodyning signal and is assigned to a third compartment 37. This stage comprises a tunable frequency determining circuit 38 formed of a fixed inductor 39, an adjustable resonating capacitor 40 having a stator $40_s$ coupled to inductor 39 and a rotor $40_r$ connected to shaft 21. An auxiliary inductor 41 is connectable across inductor 39 by a high-low band diode switch 42 and a capacitor 43. Frequency determining circuit 38 is, of course, associated with an oscillation generating device such as a transistor, not shown.

The output of VHF oscillator 36 is applied to an input terminal of mixer 26 to the end that an IF output signal is developed at the output terminal 34 of the mixer for application to an IF amplifier 45. The output of IF amplifier 45, in turn, is applied to the post-IF circuitry 46 which is represented in block diagram form and which comprises the stages of the TV receiver other than those included in the tuner and IF sections. Specifically, the post-IF circuitry would include, in addition to an audio stage, the video detector, a video amplifier, an AGC supply, a sync signal separator and line and field deflection systems which, in conjunction with the video stage, reconstitute the picture portion of the received signal.

As pictorially shown in FIGS. 2–4 and as will be described, tuning shaft 21, which supports rotor-blades $20_r$, $30_r$ and $40_r$, is rotatably supported within the confines of one of the tuner housings, preferably VHF housing 13, for displacement through a predetermined angular range. Supported in this fashion, rotor blades $20_r$, $30_r$ and $40_r$ establish, when paired with their stator electrodes and inductors 19, 29 and 39, respectively, the trio of wave signal selectors 17, 28 and 38 which are tunable across the VHF band.

A conjoint operation of these three selector circuits is afforded by virtue of the fact that all the capacitor rotor blades are affixed to tuning shaft 21. This conjoint or unicontrol operation is represented in FIG. 1 by the broken construction lines extending from shaft 21. Furthermore, as indicated by conductor 47, the anodes of diode switches 23, 32 and 42 are electrically connected together so that frequency selector circuits 17, 28 and 38 are simultaneously conditioned for operation in either the low- or high-frequency portion of the VHF spectrum. While switches 23, 32 and 42 are disclosed as diodes that are rendered conductive, i.e., closed, by the application of a DC biasing voltage through switch $S_1$, it is appreciated that conventional mechanical switch devices can be substituted for the diodes. In any event, the actual switching, whether by diodes and $S_1$,$S_2$ or by mechanical apparatus, is effected by a presettable channel control mechanism which is described in appropriate detail below.

UHF tuner 12, which is also depicted schematically in FIG. 1, includes preselector, mixer and oscillator stages 50, 51 and 52 which are individually chambered in compartments 53, 54 and 55, respectively, of UHF housing 14. Preselector 50 includes a tunable frequency selector circuit 56 which is directly coupled to an antenna, and which comprises a tunable reactance element in the form of a conductor 57 having an electrical length that approaches ¼ of a wave length at the high frequency end of the UHF band. The electrical design of UHF tuner 12 preferably adopts, in general, the format of the UHF tuner disclosed in copending application Ser. No. 343,281 filed Feb. 7, 1964 in the name of Wayne H. Reynolds, which application is assigned to the assignee of the subject invention. From a mechanical standpoint, however, the structure of tuner 12 departs significantly from Reynolds' construction, which structure will be described below together with the mechanical features of the VHF tuner.

In any event, insofar as the electrical aspects of UHF tuner 12 are concerned, one end of inductor 57 is conductively secured to a wall of housing compartment 53 while the other end is terminated in one or more planar extensions which are supported by a post of insulating material. In this fashion, inductor 57 constitutes the inner conductor of a coaxial transmission line while the outer conductor is formed by the walls of compartment 53. The extensions of inductor 57 serve as the stationary electrodes $58_s$ of a tuning capacitor 58 which also includes two or more rotor electrodes or blades $58_r$ which are soldered or otherwise conductive affixed to the same tuning shaft 21 that secures the rotor blades $20_r$, $30_r$, $40_r$ of the VHF tuner capacitors. The mechanical aspects of this tuning arrangement are most readily perceived in FIGS. 2-4 which drawings are described below.

The output of preselector 50 is inductively coupled through an opening or window in the common wall separating compartments 53, 54 to the mixer stage 51. This stage also includes a tunable transmission line frequency selector 60 comprising an elongated inductor 61, similar to inductor 57, and tuned by capacitor 62 formed by the planar extensions $62_s$ of inductor 61 and a plurality of rotor electrodes $62_r$ affixed to tuning shaft 21. Stage 51 further includes a mixer diode 63 which has one lead inductively coupled to inductor 61 and conductively connected to an IF output terminal 64. The other lead of the mixer diode is returned to oscillator section 52 where it is inductively coupled to the frequency determining circuit included therein.

Oscillator stage 52 also employs a tunable quarter-wave transmission line in a frequency determining circuit 66, which circuit comprises an elongated inductor 67 the low impedance end of which is connected to a wall of compartment 55 through a capacitor 68 while its opposite end is formed into one or more planar extensions which are supported by an insulating post for presentation to the rotor electrodes of the tuning capacitor 69. As in the preselector and mixer stages the oscillator tuning capacitor 69 comprises the planar extensions $69_s$ of inductor 67 and a plurality of adjustable rotors $69_r$ which are conductively secured to tuner shaft 21 for conjoint displacement with the rotor electrodes of capacitors 58 and 62. The broken construction lines, which extend between capacitors 58, 62 and 69 and tuning shaft 21, serve to indicate that the preselector, mixer and oscillator stages are tuned in unison.

In operation the oscillator operates at a frequency which is displaced approximately 40 MHz from, and preferably above, the operating frequency of the preselector stage. This frequency separation is established by capacitor 68 which, by virtue of being disposed in series with tuning capacitor stage 69 reduces the total capacitance of the oscillator stage to a value below that of mixer tuning capacitor 62 so that the oscillator always tunes to a higher frequency than tuned circuit 60. As a result, oscillator 52 generates and applies to mixer diode 63 a signal which, when heterodyned with the signal derived by frequency selector 60, produces a 40 MHz IF signal at output terminal 64. This IF output signal is applied to a UHF amplifier 65 which can be included in the mixer compartment 27 of VHF tuner 11. The output of amplifier 65, in turn, is connected to a terminal of switch $S_2$ which selects either the output of VHF selector 17 or the output of amplifier 65 for application to VHF mixer-amplifier 26. When stage 26 is utilized as an amplifier for the IF signal derived from the UHF tuner then, of course, the VHF tuner is disabled by disconnecting energizing potential from RF stage 16 and oscillator 36. This is most readily achieved by ganging switch $S_2$ with the B+ control switch $S_3$. Note, however, that B+ energizing potential for VHF mixer stage 26 is obtained from a B+ source independent of switch $S_3$. This, of course, is necessitated because of the fact that stage 26 is used for UHF, as well as VHF operation and therefore must remain energized regardless of which television band is utilized. In any event, during UHF operation stage 26 serves to further amplify the UHF IF signal from amplifier 65 prior to its application to IF amplifier 45 wherein it is processed in the same manner as a VHF IF signal for utilization by the post IF circuitry 46.

Attention is now directed to the mechanical construction of the enclosure for tuning arrangement 10. As shown in FIG. 2, VHF and UHF housings 13, 14 are disposed in a back-to-back relation with tuning shaft 21 extending through the compartments of the VHF tuner but, see FIG. 3, rotatably journalled in apparatus adjacent the tuner housings. More particularly, the enclosure, neglecting the pair of covers $13_c$ and $14_c$, is comprised of three parts, housings 13 and 14 and the aforementioned apparatus comprising a U-shaped bracket 70, the latter not only joins the housings together as a unit but also constitutes the support for tuning shaft 21.

The VHF tuner housing 13 itself comprises a U-shaped casing which is divided into compartments 15, 27 and 37 to accommodate the various circuit components of the RF amplifier, mixer and oscillator stages 16, 26 and 36, respectively. The three sets of tuning capacitor stator electrodes $20_s$, $30_s$ and $40_s$ are secured to a ceramic rod 72 fixed to a mount 73 inside housing 13; actually, the mount 73 is fastened to the outside surface of the wall $14_b$ of the UHF tuner housing. Mount 73 also serves to support a sub-chassis 74 which extends across the three compartments to support the VHF circuit components, of which only inductor 29 for mixer selector circuit 28 is shown in FIG. 2.

Figure 2:
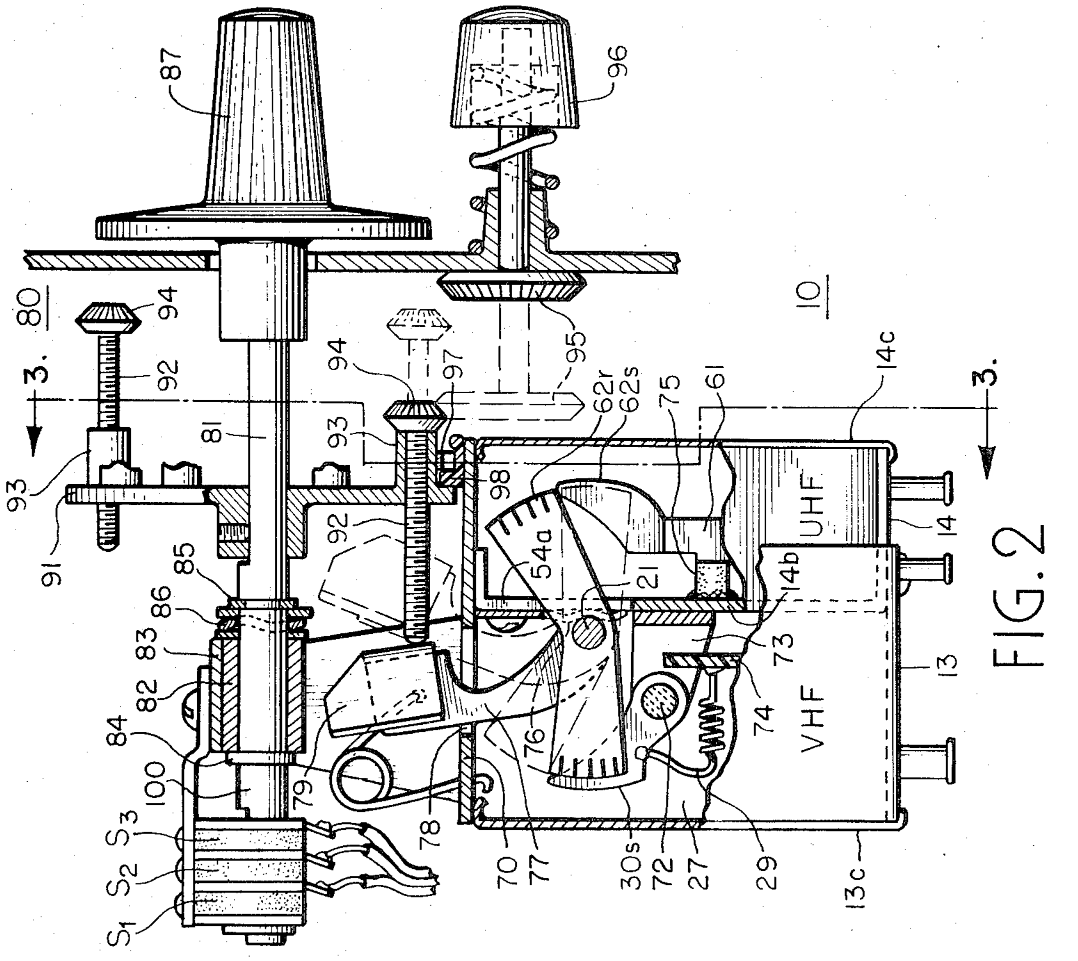
FIG. 2 is an elevational view, partly in section, of a tuning arrangement constructed in accordance with the invention.

The UHF tuner housing 14, on the other hand, comprises a four-sided body, with the top and right hand sides open, as viewed in FIG. 2. Internal compartments 53, 54 and 55 enclose the tuned transmission lines and other components of the preselector, mixer and oscillator stages with only tuned line 61 of the mixer stage illustrated in FIG. 2. The extremities of the transmission lines which constitute the stator electrodes of the tuning capacitors, are supported by the ceramic posts 75 which are anchored to the inside surface of wall $14_b$. The upper end of wall $14_b$ is relieved to provide a trio of elongated apertures or slots $53_a$, $54_a$ and $55_a$ which serve to admit rotor blades $58_r$, $62_r$ and $69_r$ for presentation to their associated respective stators $58_s$, $62_s$ and $69_s$. A multi-leaf conductive spring member 76 is in conductive engagement with the outer surface of housing wall $14_b$ and has its leaf or finger portions overlying the slots in housing wall $14_b$ but spaced from the rotor blades protruding through the slots. The function of member 76 is two-fold; first it constitutes a shield to prevent radiation from the UHF housing and, secondly, it serves as a grounding connection for tuning shaft 21 and the VHF and UHF rotors. To the latter end the finger portions are bowed outwardly to provide saddles that receive tuning shaft 21, see FIG. 2, and effect a resilient wiping engagement therewith. It should also be noted that positioning tuning shaft 21 in the VHF housing, rather than the UHF housing, is preferable in that such placement simplifies prevention of UHF radiation.

In this tripartite construction the VHF and UHF housings are processed as separate units which substantially reduces manufacturing time and costs by permitting pre-installation of all circuit components except, of course, the tuning capacitor rotors, which electrodes together with tuning shaft 21 and bracket 70, form a separate sub-unit. By forming the tuning shaft and tuning capacitor rotors as a sub-unit independent of the VHF and UHF housings, final assembly of a combination VHF-UHF tuning arrangement 10 is greatly simplified. Moreover, proper alignment of the rotor electrodes and their associated stator electrodes is also facilitated by the disclosed tripartite construction. This obtains because of the fact that bracket 70, as well as VHF and UHF housing 13 and 14 are mutually positionable, relative to each other, in that bracket 70 overlaps UHF housing 14 while VHF housing 13 overlaps bracket 70, as well as the UHF housing. This arrangement provides several degrees of freedom insofar as spatial alignment of the rotors and stators are concerned. These degrees of freedom, in turn, are utilized in conjunction with the final assembly set-up jig or tool which adjustably secures the housings and the tuning shaft sub-unit while the operator effects the correct rotor-stator alignment. Bracket 70 is then secured to the tuner housings, preferably permanently, as by brazing or soldering. On the other hand, if a take-down assembly is desired, the bracket can be secured to the housings with conventional threaded fasteners, which assembly is resorted to in the drawings, see FIG. 4, in order to clarify the manner in which housings 13, 14 and bracket 70 are cooperatively associated.

Another feature of tuning arrangement 10 which not only facilitates assembly and reduces costs, but as will be shown, readily accommodates a precision channel pre-selector mechanism resides in the construction and arrangement of the tuning shaft and the rotor electrodes. As shown in FIGS. 2 and 4, the VHF and UHF rotors are fixed to tuning shaft 21 in such a manner as to extend in substantially opposite directions from the shaft. Since the shaft extends through VHF housing 13, the VHF rotor blades $\mathbf{20}_r$, $\mathbf{30}_r$ and $\mathbf{40}_r$ are presented directly to their associated stator electrodes. On the other hand, the UHF rotors $\mathbf{58}_r$, $\mathbf{62}_r$ and $\mathbf{69}_r$ extend through slots $\mathbf{53}_u$, $\mathbf{54}_u$ and $\mathbf{55}_a$ in wall $\mathbf{14}_b$ of the UHF housing for presentation to their associated stators. As best seen in FIG. 2, the VHF and UHF rotor blades are not diametrically opposed but are canted relative to each other. The rotor positions illustrated by the solid line constructions establish VHF tuner 11 at the low frequency end of either its low or high band and UHF tuner 12 at the high end of its band. The converse, of course, holds for the rotor positions constructed by the broken lines. The included angle $\theta$, defined by the intersection of the longitudinal axis of the V and U rotor blades, is governed by the layout of the tuners, specifically, the physical positioning of the stator electrodes, as well as the space required for other constituents of the tuners. While angle $\theta$ is not critical, it is desirable that it range between 135° to 150°. This range allows for a "throw" or rotation of tuner shaft 21 of not less than 30° nor more than 45°. As will be shown, this relatively small shaft displacement greatly simplifies the mechanical considerations which must be accounted for in the pre-set drive mechanism employed for positioning the tuning shaft. In any event, across the band tuning of both tuners is effected through an identical, and substantially reduced, displacement of shaft 21. As previously noted, it is a purpose of the disclosed tuning shaft and rotor construction to provide a design that will result in a reduced arcuate displacement of the tuning shaft and rotors. This, in turn, is in keeping with the announced objective of attaining a high degree of repeat accuracy in channel preselection by providing an improved and simplified mechanical cooperation between a programming or preset mechanism to be described, and tuning shaft 21.

In order to provide the tuners with a positive acting control arrangement devoid of back-lash or error-introducing couplings, tuning shaft 21 is fitted with an extension, specifically a driver arm 77 rigidly attached to the shaft and extending through a slot 78 in bracket 70. The distal end of arm 77 is fitted with a V-shaped cam follower 79 and is spring biased in a clockwise direction, as viewed in FIG. 2, for engagement with a presettable programming mechanism 80. The programmer comprises a control shaft 81 which is rotatably mounted in a sleeve 82 which, in turn, is supported by a pedestal 83 disposed atop tuner bracket 70. The control shaft is axially restrained by a pair of C-washers 84, 85 affixed to the shaft at opposite sides of sleeve 82. For reasons soon to be apparent, a spring washer 86 is captivated between C-washer 85 and sleeve 82 to exert an axial bias on shaft 81, to the right, as viewed in FIG. 2, and maintain washer 84 seated against sleeve 83. The programmer further comprises a turret mechanism which effectively converts the continuous type VHF and UHF tuners to discrete channel selectors. To this end the turret comprises an indexable disc 91 which is keyed upon control shaft 81 for rotation therewith. A viewer actuated control knob 87 is also keyed upon shaft 81. A plurality of independent axially adjustable spindle type actuators 92 are threadably captivated in bosses 93 anchored upon and disposed about the periphery of disc 91. Preferably each actuator is provided with a multiplicity of fine threads in order to accommodate very precise displacements within its boss. Furthermore, each actuator is capped with a gearhead 94 which is engageable by the drive gear 95 of a push-to-actuate tuning control 96 when the actuator is presented to an index station. While control 96 is shown as a push-to-actuate device, it is appreciated that, alternatively, a turn-to-actuate arrangement could be employed.

In any event, the location of control 96, and specifically drive gear 95, establishes the index station for the actuators so that when an actuator is rotated from a standby position to the index station, the end of the actuator remote from the gearhead encounters and rides up the sloping surface of cam follower 79 to rotate drive arm 77 and tuning shaft 21 in a counter-clockwise direction, as viewed in FIG. 2. As also indicated in FIG. 2, an actuator occupying the index station is axially displaceable from a reference position, which is indicated by broken line construction, to a desired predetermined location, solid line construction, to rotate tuning shaft 21 and thereby tune either the VHF or UHF signal selectors to a desired television channel. Since angular displacement of tuning shaft 2 for across the band tuning is minimized in the subject tuner arrangement, i.e., a range between 30° to 45°, then the longitudinal travel or throw is correspondingly reduced. As a result the travel of follower 79 tends to approximate a linear displacement. This, of course, is in sharp contrast to the prior practice in which the shaft of a continuous type tuner is rotated from 90° to 180°. In contradistinction to that practice, it is readily apparent from FIG. 2 that axial displacement of an indexed actuator from its reference position is directly and efficiently converted to an angular displacement of tuning shaft 21 without back lash, lost motion or switching from one tuner shaft to another thus enhancing repeat accuracy. Moreover, since any actuator is adjustable to displace shaft 21 to any position within its arcuate range, and thus to any channel in either band, the subject tuning arrangement provides equalized tuning for the UHF as well as the VHF band.

Figure 3:
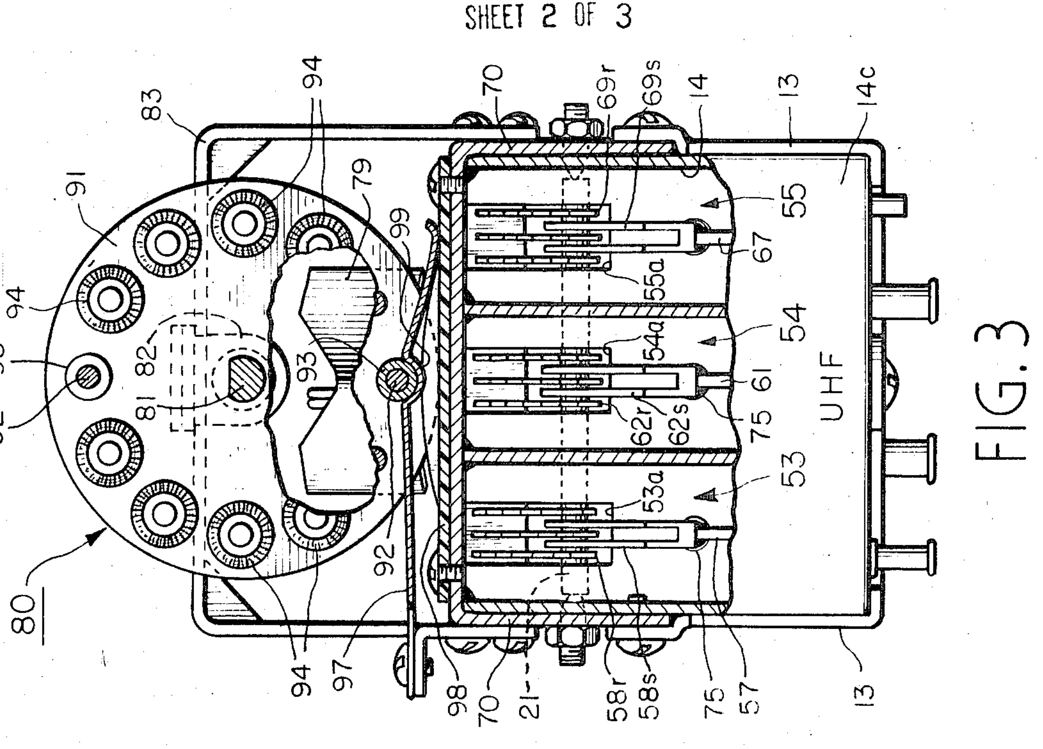
FIG. 3 is a sectional view taken along lines 3—3 of FIG. 2.
Figure 4:
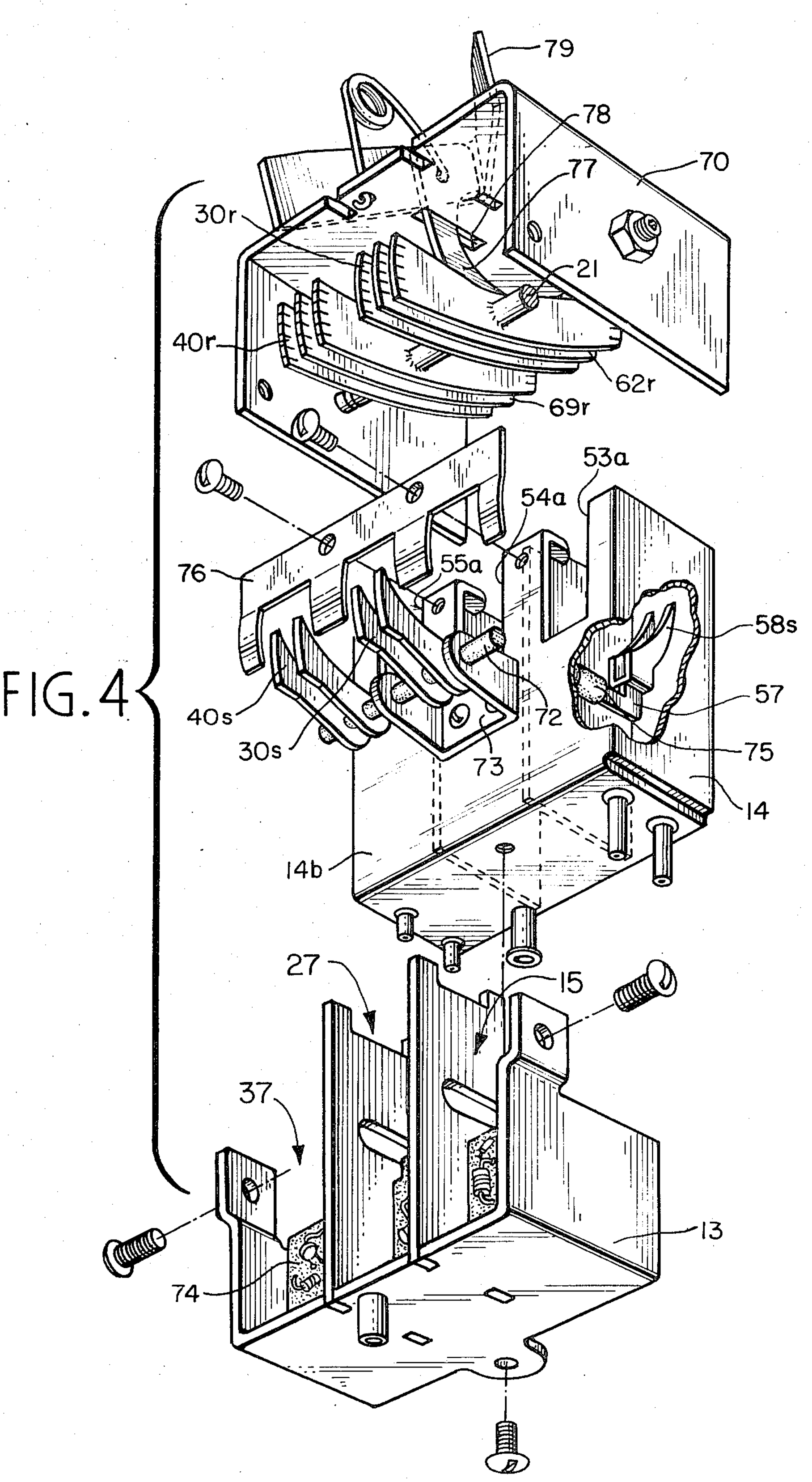
FIG. 4 is an exploded view of the tuning arrangement of FIGS. 2 and 3, presented as an aid in understanding the assembly thereof.

The actuators, which are sequentially indexed to the index station by rotating shaft 81, are retained there by a detent mechanism comprising an elongated leaf spring 97 which has one end fastened to tuner bracket 70 and its opposite end bearing against an arrest member comprising an L-shaped abutment plate 98 which is also fastened to bracket 70, see FIG. 3. Leaf 97 has a nesting portion 99 intermediate its extremities for releasably retaining the boss 93 of an indexed one of actuators 92.

Repeat accuracy, insofar as channel preselection is concerned, requires that tuning shaft 21 be always returned to the exact angular position it occupied with the spindle assigned to the particular channel is again returned to the index station. This accuracy is enhanced in the disclosed tuning arrangement by virtue of the conjoint action of spring washer 86 and abutment 98 upon that portion of turret disc 91 occupying the index station. More particularly, spring 86 exerts a steady pressure on control shaft 81 and disc 91 to the right, as viewed in FIG. 2, so that disc 91 is urged against abutment 98. As a result, disc 91 and, more importantly, the boss 93 occupying the index station, always returns to the same location thus insuring that the indexed actuator always drives cam follower 79 and, of course, tuning shaft 21, to the predetermined angular position assumed by the shaft when the indexed actuator was initially pre-set. Since this arrangement precludes back-lash and lost motion, insofar as the indexed actuator is concerned, exceptional repeat accuracy is achieved.

The programming mechanism 80 further includes means for performing the switching functions required in operating the VHF and UHF tuners. More particularly, switches $S_1$, $S_2$ and $S_3$ are mounted upon a rearwardly projecting extension 100 of the control shaft 81. These switches are keyed upon the control shaft in such a fashion that only selected ones are actuated when a particular one of actuators 92 assumes the index station. In other words, when an actuator assigned to VHF channel 2 is transported to the index station, the n switch $S_1$ is conditioned for low VHF band operation, switch $S_2$ is conditioned for VHF operation and switch $S_3$ is conditioned so that B+ is applied to the RF and oscillator stages 16 and 36 of the VHF tuner. On the other hand, if an actuator assigned to a UHF channel is rotated to the index station, then $S_1$ is opened, $S_2$ is switched to UHF and $S_3$ connects B+ to UHF oscillator 52 and UHF-IF amplifier 65. A simplified switching arrangement is most readily achieved by assigning certain groups of actuators to specific television bands. For example, and referring to FIG. 3, the actuators occupying positions corresponding to 12 o'clock through 3 o'-clock, inclusive can be assigned to low band VHF, actuators located at 4 o'clock through 7 o'clock inclusive can be assigned to high band VHF while actuators located at 8 o'clock through 11 o' clock, inclusive can be assigned to the UHF band. Of course, any other assignment or division of actuators is permissible, depending upon the channels available in a particular locale.

While particular embodiments of the invention have been shown and described, modifications may be made, and it is intended in the appended claims to cover all such modifications as may fall within the true spirit and scope of the invention.

I claim:

1. A tuning arrangement for selectively tuning a television receiver to any channel in the VHF or UHF frequency bands, said arrangement comprising:

a first housing enclosing a first tunable reactance circuit;

a second housing disposed in a back-to-back relation to said first housing and enclosing a second tunable reactance circuit;

an adjustable tuning shaft extending through one of said housings for displacement through a predetermined range and supporting a first electrode that extends into said first housing to form, when coupled to said first reactance circuit, a first resonant wave signal selector tunable across the VHF frequency band;

said shaft further supporting a second electrode that extends into said second housing to form, when coupled to said second reactance circuit, a second resonant wave signal selector tunable across the UHF frequency band;

band selector means for operatively coupling, alternatively, one of said first and second wave signal selectors to signal utilization circuitry of said receiver;

and drive means engageable with said tuning shaft for positioning said first and second electrodes, relative to their associated reactance circuits, to tune that one of said wave signal selectors coupled to said utilization circuitry to any television channel within its band.

2. A tuning arrangement as set forth in claim 1 in which said first tunable reactance circuit comprises a fixed value inductance and said second tunable reactance circuit comprises a section of a transmission line having an electrical length approximating ¼ of a wave length at the high frequency end of the UHF band.

3. A tuning arrangement as set forth in claim 1 in which said tuning shaft is rotatably mounted for adjusting the coupling between said first electrode and said first reactance circuit and between said second electrode and said second reactance circuit to select a signal for resonating that one of said signal selectors coupled to said utilization circuitry.

4. A tuning arrangement as set forth in claim 1 in which said first tunable reactance circuit comprises a first inductance element and a first fixed capacitor electrode;

said second tunable reactance circuit comprises a second inductance element and a second fixed capacitor electrode;

and said first and second shaft supported displaceable electrodes are arranged for adjustable presentation to said first and second fixed capacitor electrodes, respectively.

5. A tuning arrangement as set forth in claim 4 further comprising apparatus for rotatably supporting said tuning shaft and for securing said first and second housings with their fixed capacitor electrodes in a predetermined spatial alignment with their associated displaceable electrodes so that said first and second wave signal selectors are tunable across their frequency bands by said displaceable electrodes as said tuning shaft is rotated through its range.

6. A tuning arrangement as set forth in claim 3 in which said drive means comprises a presettable programmer having a plurality of actuators each independently engageable with said tuning shaft and displaceable from a reference position to a predetermined location to rotate said shaft to tune that one of said wave signal selectors coupled to said utilization circuitry to a desired television channel within its band.

7. A tuning arrangement as set forth in claim 6 in which each of said presettable actuators is axially displaceable to a predetermined location so that the longitudinal displacement of said actuator from said reference position is directly related to an angular displacement of said tuning shaft.

8. A tuning arrangement as set forth in claim 7 in which said programmer comprises a rotatably mounted turret for supporting said actuators for axial displacement and for transporting said actuators sequentially from a standby position to an index station wherein the indexed one of said actuators directly engages an extension of said tuning shaft to convert said longitudinal displacement of said indexed actuator to said angular displacement of said tuning shaft.

9. A tuning arrangement as set forth in claim 8 which further includes an arrest disposed adjacent said index station and means for urging at least that portion of said turret occupying said index station against said arrest to define said reference position for said actuators, so that upon entering said index station, each of said actuators consistently applies a predetermined arcuate displacement to said tuning shaft in accordance with its longitudinal displacement from said reference position.

10. A tuning arrangement as set forth in claim 8 which further includes means for restricting the rotation of said tuning shaft to an arcuate displacement not greater than approximately 45° so that the travel of that portion of said tuning shaft extension engaging said indexed one of said actuators approximates a linear displacement.

11. A tuning arrangement for selectively tuning a television receiver to any channel in the VHF or UHF frequency bands, said arrangement comprising:

a first housing enclosing a first group of tunable reactance circuits;

a second housing disposed in a back-to-back relation to said first housing and enclosing a second group of tunable reactance circuits;

an adjustable tuning shaft extending through one of said housings for displacement through a predetermined range and supporting a first group of electrodes that extend into said first housing to form, when coupled to said first group of reactance circuits, a first plurality of resonant wave signal selectors each tunable across said VHF band and constituting a preselector stage, an oscillator stage and a mixer stage;

said shaft further supporting a second group of electrodes that extend into said second housing to form, when coupled to said second group of reactance circuits, a second plurality of resonant wave signal selectors each tunable across the UHF band and constituting a preselector stage, an oscillator stage and a mixer stage;

band selector means for operatively coupling, alternatively, one of said first and second pluralities of wave signal selectors to signal utilization circuitry of said receiver;

and drive means engageable with said tuning shaft for positioning said first and said second groups of electrodes, relative to their associated reactance circuits, to tune that plurality of said wave signal selectors coupled to said utilization circuitry to a desired television channel.

* * * * *